(12) United States Patent
Brown

(10) Patent No.: US 9,631,866 B1
(45) Date of Patent: Apr. 25, 2017

(54) HEAT ENGINE

(71) Applicant: BROWN CRAVENS TAYLOR, Sebastopol, CA (US)

(72) Inventor: Curtis Del Brown, Nevada City, CA (US)

(73) Assignee: BROWN CRAVENS TAYLOR, Sebastopol, CA (US)

(*) Notice: Subject to any disclaimer, the term of this patent is extended or adjusted under 35 U.S.C. 154(b) by 351 days.

(21) Appl. No.: 14/455,852

(22) Filed: Aug. 8, 2014

(51) Int. Cl.
| F27B 5/06 | (2006.01) |
| G21B 3/00 | (2006.01) |
| H01L 35/30 | (2006.01) |
| F24J 1/00 | (2006.01) |
| G21B 1/00 | (2006.01) |
| H01M 8/06 | (2016.01) |
| G21G 1/00 | (2006.01) |
| C25B 15/00 | (2006.01) |
| H01L 35/12 | (2006.01) |
| H02K 44/00 | (2006.01) |

(52) U.S. Cl.
CPC .............. *F27B 5/06* (2013.01); *C25B 15/00* (2013.01); *F24J 1/00* (2013.01); *G21B 1/00* (2013.01); *G21B 3/00* (2013.01); *G21G 1/00* (2013.01); *H01L 35/12* (2013.01); *H01L 35/30* (2013.01); *H01M 8/06* (2013.01); *H02K 44/00* (2013.01)

(58) Field of Classification Search
CPC .. F27B 5/06; H02K 44/00; G21B 3/00; G21B 1/00; G21G 1/00; C25B 15/00; H01M 8/06; F24J 1/00; H01L 35/30; H01L 35/12
USPC ............................ 60/643, 645; 310/301, 306
See application file for complete search history.

(56) References Cited

U.S. PATENT DOCUMENTS

| 3,150,483 | A | * | 9/1964 | Mayfield | ............... | B64G 1/405 310/11 |
| 4,023,065 | A | * | 5/1977 | Koloc | ................ | H05H 1/04 313/161 |
| 4,039,352 | A | * | 8/1977 | Marinescu | ............. | H01L 37/02 136/205 |
| 8,485,791 | B2 | * | 7/2013 | Cravens | ................. | H02K 44/00 417/48 |
| 2005/0271916 | A1 | * | 12/2005 | Yang | ..................... | C01B 3/0005 429/421 |
| 2008/0123793 | A1 | * | 5/2008 | Loan | ........................ | G21B 3/00 376/156 |
| 2010/0209335 | A1 | * | 8/2010 | Mills | ......................... | B01J 7/00 423/648.1 |
| 2011/0300002 | A1 | * | 12/2011 | Cravens | ................ | H02K 44/00 417/50 |

* cited by examiner

*Primary Examiner* — Hoang Nguyen
(74) *Attorney, Agent, or Firm* — Fish & Tsang, LLP

(57) ABSTRACT

A heat engine that utilizes a controllable heat source that includes a body comprising a dopant that has an affinity for a fuel species, preferably a hydrogen isotope. The production of heat by the heat source can be modulated by the application of electric and/or magnetic fields to the body. The hear engine includes safety features that prevent excessive heat generation.

18 Claims, 4 Drawing Sheets

HEAT ENGINE

FIELD OF THE INVENTION

The field of the invention is heat engines, specifically heat engines that utilize hydrogen as fuel.

BACKGROUND

The production of heat for use in heat engines that convert heat into mechanical or electrical energy has been historically accomplished directly or indirectly by the burning or oxidation of chemical fuel or by nuclear energy, specifically fission. While the use of combustible fuels has certain advantages this practice consumes increasingly scarce fuel resources or use renewable but unreliable sources, while generating greenhouse gases. Nuclear energy via fission has the disadvantage of utilizing dangerous radioactive elements as "fuel" while generating nuclear waste.

Attempts have been made to utilize materials that have an affinity for hydrogen to facilitate production of heat using hydrogen as an energy source. For example, European Patent No. EP 0767962B1 (to Piantelli) describes a device that utilizes an electrode that receives and sequesters a hydrogen isotope within the crystalline lattice structure of the electrode material under the influence of a magnetic field. Subsequent heating of the material results in the initiation of a fusion reaction. Unfortunately, the available reaction area of such an electrode is limited, and there is no provision for control of the resulting reaction.

Previously, the Applicants have pioneered new and novel heating elements as disclosed in co-owned U.S. patent application publication 2011/0300002 (to Cravens et al). These utilize a hydrogen permeable ceramic matrix that includes metallic particles that have an affinity for hydrogen and/or hydrogen isotopes, and imbedded driver and control elements.

All publications identified herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

Thus, there is still a need for a heat engine that utilizes simple, effective, and controllable heat source which utilizes hydrogen and/or a hydrogen isotope as an energy source.

SUMMARY OF THE INVENTION

The inventive subject matter provides apparatus, systems and methods in which a heat engine utilizes a controllable heat source that consumes a hydrogen or hydrogen isotope fuel to generate heat. In the context of this application heat engines are understood to include devices that transform heat into kinetic or electrical energy.

One embodiment of the inventive concept is a heat engine that includes a main body that is permeable to a fuel species, where the main body includes a dopant that has an affinity for the fuel species, at least one controllable operating field source that generates an operating field which intersects the main body, and a controller that is configured to modulate the operating field. When the heat engine is in operation the main body generates heat, and modulation of the operating field provides control of the generation of heat by the main body. The operating field can be a magnetic field, and electrical field, or can incorporate both magnetic and electric fields. The heat engine can include a proton conductor that undergoes a change in a physical property (for example phase, physical dimension, proton conductivity) at a characteristic temperature, such that the change in the physical property renders the heat engine at least partially inoperable. Such a proton conductor can be identified within the heat engine without disassembly or destructive testing.

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWINGS

FIG. 2A shows the initial results from initiating field modulations. FIG. 2B shows the long term results from initiating field modulations.

DETAILED DESCRIPTION

Figure 1:
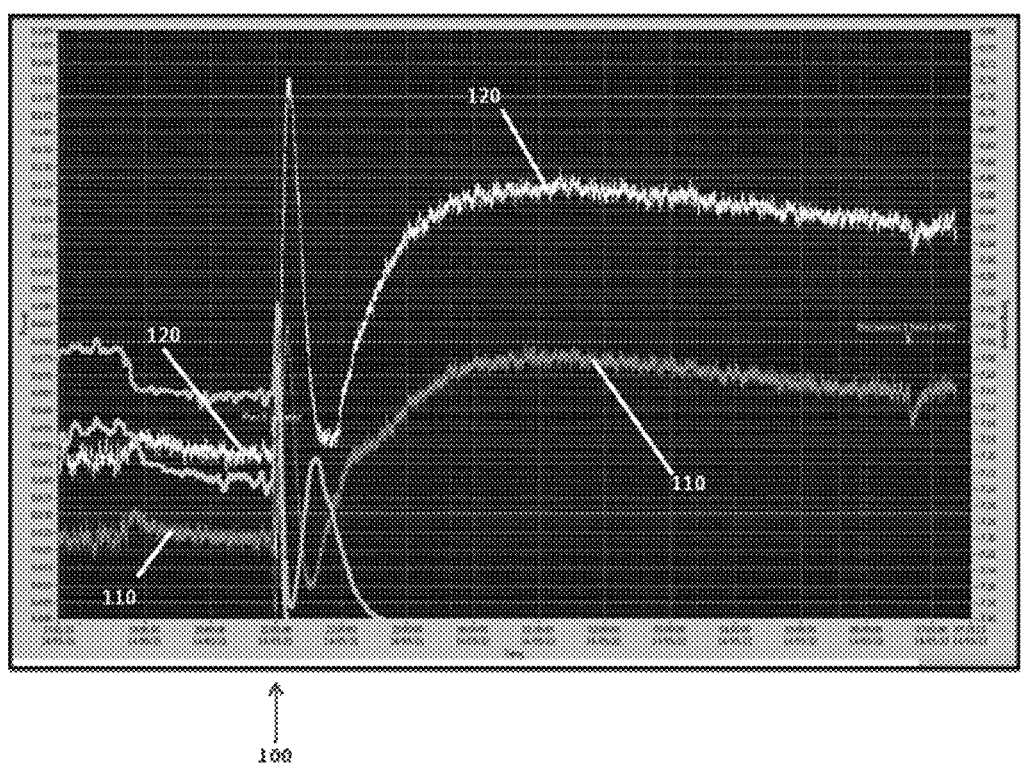
FIG. 1 shows results of the use of an electric operating field on a heat-generating body of a heat engine of the inventive concept.

The inventive subject matter provides apparatus, systems and methods in which a heat engine utilizes a controllable heat source that consumes a hydrogen or hydrogen isotope fuel to generate heat. The heat source for the heat engine is a body that is porous with respect to a fuel species and that incorporates a dopant with an affinity for the fuel species. The generation of heat is initiated and otherwise modulated through the use of an operating field (which can have magnetic and/or electric components) that can be modulated by a controller. The heat engine can include a proton conductor that reacts to temperature, where the proton conductor can at least partially disable heat production by the body when a threshold temperature is exceeded. It should be appreciated that in the context of this application heat engines are understood to include devices that transform heat into kinetic or electrical energy.

One embodiment of the inventive concept is a heat engine that includes a main body that is permeable to a fuel, where the main body includes a dopant that has an affinity for the fuel species, at least one magnetic field source (for example, a coil or a permanent magnet) that generates an operating field in the form of a magnetic field which intersects the main body, and a controller that is configured to modulate the magnetic field (for example, by modulating current and/or voltage supplied to a coil or by manipulation of a permanent magnet). When the heat engine is in operation the main body generates heat, and modulation of the magnetic field provides control of the generation of heat by the main body. Suitable modulations of the magnetic field include orientation and/or magnetic field strength. Magnetic field strengths can range from as low as that of the earth's magnetic field at the location of the body up to 10,000 gauss. In some embodiments of the inventive concept magnetic field strength can exceed 10,000 gauss. Modulations of the magnetic field can be patterned to produce appropriate magnitudes and orientations of the field interacting with the body at desired intervals and/or to conform to desired waveforms. Such a pattern can be static or dynamic. For example, a pattern can generated using a fixed permanent magnet or by the movement of a permanent magnet relative to the body. Similarly, patterning of a magnetic field can be performed by utilizing a set of electromagnetic field coils associated with the body and appropriately sequencing the timing and amplitude of current supplied to the field coils.

Another embodiment of the inventive concept is a heat engine that includes a main body that is permeable to a fuel, where the main body includes a dopant that has an affinity for the fuel species, at least one electric field source (for example, an electrode) that generates an operating field in the form of an electric field which intersects the main body, and a controller that is configured to modulate the electric field (for example, by modulating current and/or voltage supplied to an electrode). When the heat engine is in operation the main body generates heat, and modulation of the electric field provides control of the generation of heat by the main body. Modulations of the electric field include orientation (i.e. polarity) and magnitude. Modulations can be applied as a waveform, for example a DC waveform, an AC waveform, and/or an AC modulated waveform. Such waveforms can be applied at frequencies ranging from 1 mHz to 20 mHz or higher.

Another embodiment of the inventive concept is heat engine that includes a main body that is permeable to a fuel, where the main body includes a dopant that has an affinity for the fuel species, at least one electric field source (for example, an electrode) and at least one magnetic field source (for example, a permanent magnet or a coil) that generates a combined operating field in the form of an electric field and a magnetic field which intersect the main body, and a controller that is configured to modulate the electric field and/or the magnetic field. In such an embodiment the electric field and the magnetic field can be modulated independently of one another. In some embodiments the coil of a magnetic field source can act as an electrode for an electric field source (for example, by being in electrical communication with a voltage source). The combined magnetic field and electric field can comprise an operating field. When the heat engine is in operation the main body generates heat, and modulation of the combined operating field provides control of the generation of heat by the main body. The combined operating field can be modulated and patterned by modulation of the magnetic field component, the electric field component, or both magnetic and electric field components as described above.

Another embodiment of the inventive concept is a heat engine that includes two or more bodies. In such a heat engine each body includes a dopant that has an affinity for the fuel. Such a heat engine also includes one or more operating field sources, where the operating field can be a magnetic field, and electric field, or a combined magnetic and electric field. A heat engine of the inventive concept can utilize multiple operating field sources that each act essentially on a single body, a single operating field source that acts on all bodies, a set of operating field sources that each act on a subset of a group of bodies, or a combination of these. Such a heat engine can also include a control system that can modulate the activity of at least one of the operating fields, and thereby modulate the production of heat by one or more of the bodies. In some embodiments of the inventive concept the control system can control two or more of the operating fields of the system. The bodies of such a heat engine can be arranged in a linear arrangement, a two dimensional array, or a three dimensional array.

In a heat engine of the inventive concept, control of a magnetic field can induce and/or modulate production of heat by the body. In a preferred embodiment, a magnetic source (i.e. a permanent magnet and/or an electromagnet) is positioned near the body. Changing the distance between the magnetic source and the body, the orientation or polarity of the applied magnetic field, and/or the applied field strength modulates the power (i.e. heat) generated by the body. For example, in use such a magnetic field can be placed in an initial configuration that initiates the production of heat, a final configuration that halts the production of heat, and intervening configurations that modulate the amount of heat produced to the desired extent.

It should be appreciated that, depending upon the construction of the body, distribution of dopant, and distribution of fuel species, such heat may generated within the body, on the surface of the body, or both within and at the surface of the body. For example, if a toroidal body primarily composed of ceramic throughout which the dopant and fuel species are dispersed and covered with surface layer that does not include dopant is utilized, heat will be generated within the body. If a similar toroidal body is utilized that has the same composition throughout and at the surface heat generation can occur within the body and at the surface of the body. Alternatively, if such a toroidal body without an insulating surface layer is exposed to a fuel species such that only the dopant at the surface can interact with the fuel species (for example, by flowing a gas over the body surface), only the surface of the body may generate heat.

A heat engine of the inventive concept includes a body, which is utilized to generate heat. Heat can be generated within the body, on a surface of the body, or both. The body can include a solid state matrix that includes a dopant with an affinity for a fuel species. In a preferred embodiment, the material composing the body is permeable (for example, by virtue of being porous) with respect to a fuel species. In preferred embodiments the solid state matrix can be a ceramic or can incorporate a zeolite. The solid state matrix can incorporate one or more dopants that have an affinity for fuel species utilized in the heating element. Such dopants can be in the form of discrete metallic particles, crystalline species, inclusions, etc. For example, if the fuel species is hydrogen or a hydrogen isotope, suitable dopants can include platinum, palladium, and/or nickel.

A body of heat engine can be in contact with one or more operating elements that generate an operating field that can be modulated to modulate or otherwise control the generation of heat by the body. For example, a number of such operating elements can be wrapped around an exterior surface of the main body. Examples of suitable operating fields include magnetic fields, electrical fields, and magnetic and electrical fields used in combination (i.e. an electric/magnetic field).

A heat engine of the inventive concept can also include an activatable safety feature. The activatable safety feature can be a permeable to the fuel species (for example, a proton conductor). In a preferred embodiment of the inventive concept the activatable safety feature incorporated into all or one or more portions of the body. The activatable safety feature can be selected or configured to be responsive to temperature. For example, an activatable safety feature can change shape or dimension as temperature changes, undergo phase changes (for example, from solid to liquid), or vary in degree of proton conductivity and/or proton insulation as temperature changes. Such an activatable safety feature can be selected such that its response to elevated temperature degrades or eliminates the ability of the body to generate heat, thereby acting as a safety device that prevents excessive production of heat by the body. In a preferred embodiment of the inventive, the presence of an activatable safety feature in the heat engine can be determined without the need for disassembly or destructive testing of the heat engine.

Similarly, a heat engine of the inventive concept can include an activatable safety feature that releases substances that degrade or eliminate the ability of the body to produce heat when the temperature of the body or other heat engine components exceeds a threshold temperature. Such a safety device can release a compound that reduces or eliminates the capacity of the dopant to interact with the fuel species, or that reacts with the fuel species to produce a product that does not support the heat generating reaction. For example, in a heat engine utilizing a hydrogen isotope as a fuel species such an activatable reaction terminator could release oxygen when the temperature exceeds a temperature threshold, resulting in the formation of a compound (i.e. water) that does not interact with the dopant. Alternatively, an activatable reaction terminator could release a compound that has an affinity for the dopant and reduces the ability of the dopant to interact with the fuel species (for example, a non-reactive isotope of the fuel species) when the temperature of the body exceeds a temperature threshold.

In some embodiments of the inventive concept, the body of the heat engine is brought to an initiation temperature prior to the initiation of heat generation. Below this initiation temperature fuel consumption and concomitant energy production does not occur at a useful rate. This initiation temperature can be ambient temperature or higher. In some embodiments the operating temperature is between 50° C. and 1000° C. In other embodiments the initiation temperature is between 100° C. and 500° C. In still other embodiments the initiation temperature is equal to or greater than about 300° C. The body can be brought to initiation temperature by enclosing all or part of the heat engine in a heat source (such as an oven or other heated enclosure) or by applying a heat source to the body (either directly or by placing it in thermal communication with the body). For example, a resistance heater can be placed in thermal contact with the body of the heat engine and used to bring it to initiation temperature prior to initiation of fuel consumption by the operating field.

It should be appreciated that generation of heat by the body during heat engine operation can generate an operating temperature that can maintain or exceed the initiation temperature, thereby allowing the heat engine to be self sustaining in this regard. Work or energy can be extracted from the heat engine as a function of the difference between the operating temperature and the initiation temperature. It should also be appreciated that extraction of excessive work or energy from the heat engine can cause the operating temperature of the heat engine and/or the associated body to fall below the initiation temperature, halting the production of heat by the body and thereby acting as a safety feature.

As noted above, a heat engine of the inventive concept can include a controller that modulates the operating field, and thereby heat generation within the heat engine. The controller can utilize temperature data (for example, from temperature sensors (for example, a thermocouple) in thermal communication with the body or from monitoring of infrared radiation emitted by the body. In some embodiments of the inventive concept the controller utilizes an algorithm that incorporates a feedback loop, utilizing the temperature data to modulate the operating field to maintain a designated temperature or energy output. The controller can also utilize an algorithm that incorporates a feedback loop that utilizes temperature data to modulate the operating field to ramp the temperature or energy output from a first setpoint to a second setpoint. Such setpoints can be entered by an operator or generated by an automated system that monitors or determines the energy needs of a system deriving power from the heat engine. In a preferred embodiment, the algorithm accesses a database that includes information related to historical energy use, projected energy use, and operational limits of the heat engine in order to determine appropriate timing and ramping rates for modulation of the operating field. In some embodiments the controller can provide a notification to an operator of error conditions or failure of the heat engine and/or fuel supply.

Such a control algorithm can be implemented via an imbedded system, one or more application specific integrated circuits, custom integrated circuits, commercial off the shelf integrated circuits, and/or discrete components. Such circuitry can be integrated into the heat engine or be in a separate location. In some embodiments of the inventive concept, power for the control circuitry can be derived from thermoelectric devices associated with the heat engine.

It should be appreciated that such control algorithms can be implemented on any suitable combination of computing devices, including servers, interfaces, systems, databases, agents, peers, engines, controllers, or other types of computing devices operating individually or collectively. One should appreciate the computing devices comprise a processor configured to execute software instructions stored on a tangible, non-transitory computer readable storage medium (e.g., hard drive, solid state drive, RAM, flash, ROM, etc.). The software instructions preferably configure the computing device to provide the roles, responsibilities, or other functionality as discussed below with respect to the disclosed apparatus. In especially preferred embodiments, the various servers, systems, databases, or interfaces exchange data using standardized protocols or algorithms, possibly based on HTTP, HTTPS, AES, public-private key exchanges, web service APIs, known financial transaction protocols, or other electronic information exchanging methods. Data exchanges preferably are conducted over a packet-switched network, the Internet, LAN, WAN, VPN, or other type of packet switched network. Such networks can utilize wired or wireless data connections.

The inventors contemplate that, in addition to providing control of the heat engine, such control systems can report data, meter or otherwise monitor energy produced by the heat engine, project the need for and proactively notify a user of the need for maintenance of the heat engine, and provide billing.

A heat-generating body incorporated into a heat engine of the inventive concept can have any suitable configuration. In a preferred embodiment of the inventive concept the body has an essentially toroidal configuration. Field sources of a heat engine of the inventive concept can be completely or partially imbedded in such a body, applied to or positioned in close proximity to a surface of such a body, or be placed at an effective operating distance from the body. Various configurations of suitable heat-generating bodies and associated field sources are disclosed in co-owned U.S. Pat. No. 8,485,791 and co-owned U.S. patent application Ser. No. 14/279,657, which are hereby incorporated in their entirety.

A heat engine can be generally understood to be a device that converts heat into other forms of power or energy. Heat engines of the inventive concept include a body that is permeable to a fuel species and also includes a dopant that has an affinity for the fuel species, a field source that provides an operating field that intersects at least a portion of the body, and a field source controller that is acts on the field source to modulate the operating field, where modulation of the operating field modulates heat generated by the body. Essentially, the body acts as a controllable heat source with control being supplied by modulation of an operating field via a controller. Such a heat source is useful in a wide variety of heat engine configurations, and can act directly or indirectly. Examples of indirect action include transmission of heat through a heat conductor (for example, a heat pipe or a liquid metal such as sodium) to a distant location and/or through acting on a working fluid (for example through conversion of water to steam or expansion of a working gas). The configuration of a heat engine of the inventive concept is dependent upon the application. For example, a heat engine of the inventive concept can be a Sterling engine that incorporates a body, field source, and controller as described above, thereby providing mechanical energy. Similarly, a heat engine of the inventive concept can be a turbine that is driven by expanding gas or steam generated by a heat-generating body as described above. Such mechanical energy can be utilized directly, or can be coupled to a generator or alternator to provide electrical energy.

Alternatively, a heat engine of the inventive concept can generate electrical energy by direct conversion via an associated thermoelectric generator and/or magnetohydrodynamic effects. For example, a heat engine of the invention can have components of the heat engine (for example, body materials and dopant) deposited on a semiconductor surface and used in conjunction with an operating field and a thermoelectric transducer to provide electrical energy to an integrated circuit.

In some heat engines of the inventive concept, heat generated by the body can be converted into kinetic energy without intervening mechanisms. For example, a heat engine configured as an array of heat generating bodies that is supplied with a channeled air flow can cause the channeled air to expand. The expanding air, suitably directed, can act as jet thrust. In another example, a heat engine of the inventive concept can act to accelerate mass using heat energy (for example, by inducing a phase change, ablation, expansion of a gas phase, etc.) to provide thrust. In such an example, the mass that is used to generate thrust can be derived from the reaction of the fuel species utilized in the heat engine. For example, in a heat engine utilizing deuterium for fuel, the resulting helium product can be heated and the expanding gas directed to provide thrust and simultaneously remove waste products.

As noted above, heat engines of the inventive concept utilize a fuel species, which is introduced to a heat-generating body that includes a dopant that has an affinity for the fuel species. In a preferred embodiment, the fuel species is a hydrogen isotope. In a particularly preferred embodiment the fuel species is deuterium. Fuel can be supplied in a variety of ways. In some embodiments of the inventive concept the heat engine is supplied pre-fueled and does not include a mechanism for refueling. For example, a heat engine can be provided that incorporates a supply of gaseous or liquid hydrogen isotope fuel. In other embodiments a heat engine of the inventive concept can be refueled by replacing all or a portion of the body, where the body is pre-loaded with a fuel species. In still other embodiments, the heat engine includes an access port or similar device that permits replenishment or replacement of fuel, for example by addition of a gas or liquid containing a hydrogen isotope to the heat engine.

In other embodiments of the inventive concept, the fuel species can be extracted from the surrounding environment. Hydrogen isotopes, such as deuterium, can be extracted from fresh or seawater (for example, for replenishment of fuel for a heat engine of the inventive concept utilized on a ship) or from water vapor in the surrounding air. Similarly, stationary systems can be fueled by extracting a fuel species from rain water or waste water.

EXAMPLES

Examples of control of heat production from bodies suitable for use in a heat engine are shown below. In these studies the bodies are comprised of a zirconium-containing ceramic matrix that include approximately 170 μg of a palladium dopant in the form of 2 nm to 4 nm particles. The studies are performed using discoidal bodies with a diameter of about 12 mm and a thickness of about 2 mm, which are fueled by exposure to deuterium gas at 1 atmosphere. Some studies include a control body that is identical to the test body but lacking in deuterium fuel. Both bodies are raised to an initial operating temperature of 300° C. The temperature of each body is monitored and a feedback loop used to supply power to maintain each body at the operating temperature. A decrease in the power required to maintain the temperature of a test body relative to that of a control body is an indication of heat being generated by the test body.

FIG. 1 shows the results of the use of an applied electric field as an operating field to initiate heat generation in two fueled bodies 110, 120. An electric operating field configured for initiation (in this instance a 1 Hz AM modulation of a 10 MHz sinusoidal carrier frequency at 20 ppv was applied) at the time point 100. Following application of the operating field the temperatures of these fueled bodies were observed to increase by approximately 0.2° C. to 0.3° C., which was maintained.

Figure 2A:
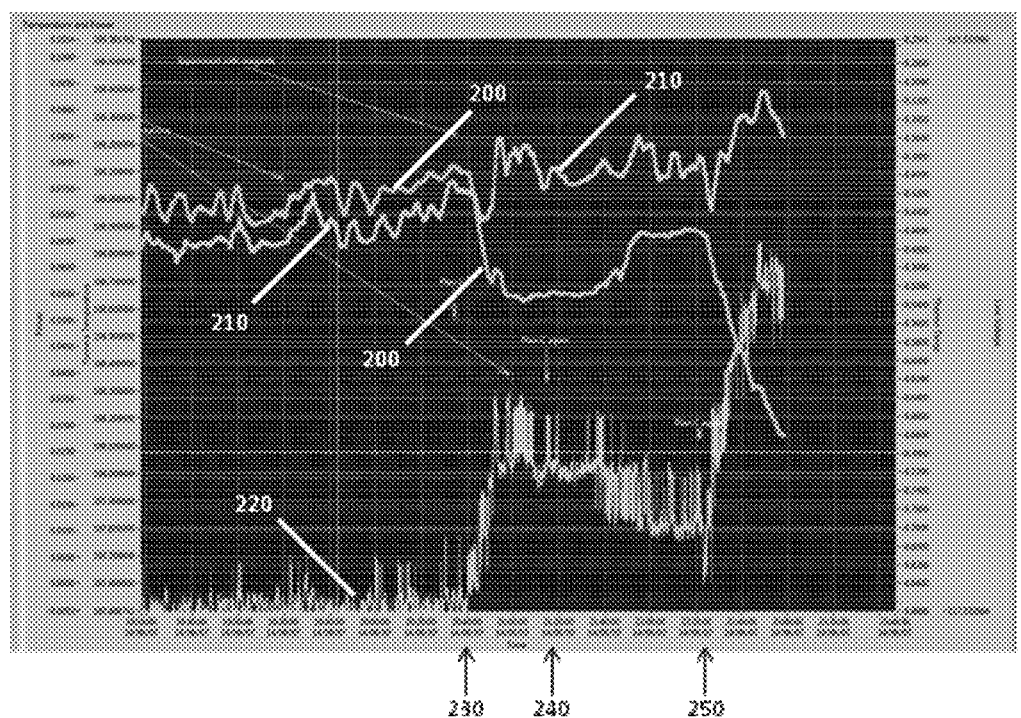
FIG. 2A and FIG. 2B show results of the use of a magnetic operating field on a heat-generating body of a heat engine of the inventive concept.
Figure 2B:
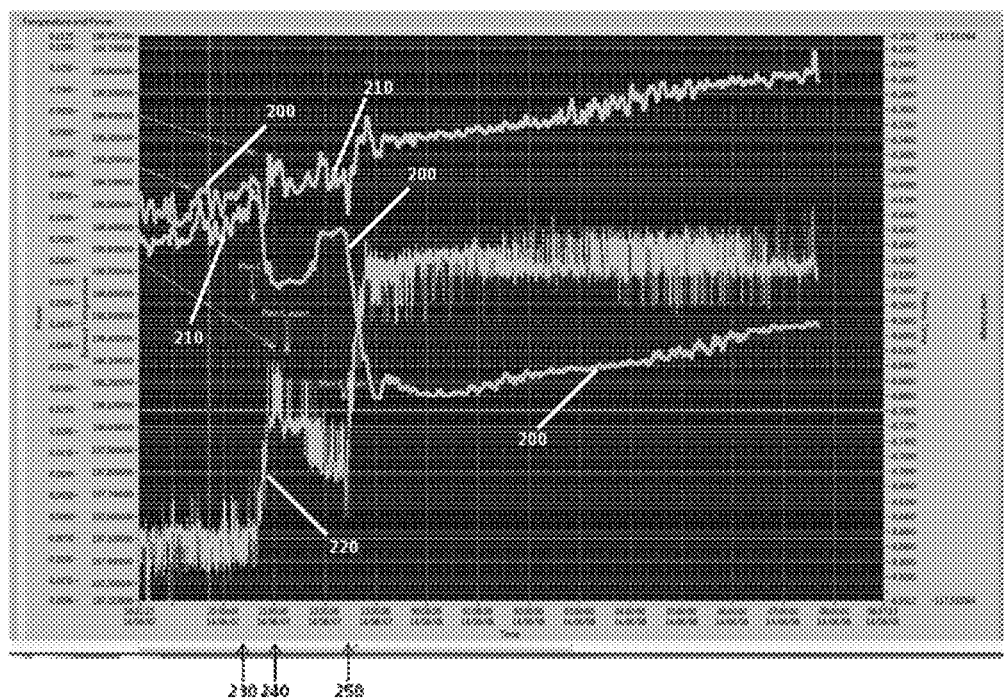

FIG. 2A and FIG. 2B show the results of the use of an applied magnetic field as an operating field to initiate heat generation in a fueled body. In this example, the magnetic field is supplied by a permanent magnet which can be moved relative to a fueled body and a control (i.e. unfueled, but otherwise identical) body. In these studies the magnets used were neodymium cylindrical permanent magnets approximately 50 mm in diameter and 150 mm in length. Four pole pieces were placed in a circular arrangement with north and south poles adjacent to one another, with the length of a cylindrical enclosure surrounding the body being exposed to the field. Orientation of the magnet was controlled around all axes, roll, yaw, and height. Generally, roll settings and yaw settings between 0° and 90° were used. The height of the magnet from the bodies ranged from around 50 mm to around 300 mm. The root mean square (RMS) of the power applied to the control body is shown in trace 210, whereas the RMS of the power applied to the fueled body is shown in trace 200. The difference in the power applied to the control body relative to the fueled body is shown in trace 220. Several instances (230, 240, 250) of the application of a magnetic operating field configured to initiate the generation of heat by the fueled body were used. As shown in traces 200 and 220, application of the magnetic operating field results in the generation of heat (and therefore decreased application of power) to the fueled body relative to the control body. FIG. 2A shows the short term results of such studies. FIG. 2B shows additional time points from the same study, and demonstrates that the heat generating reaction persists following initiation with a magnetic operating field supplied by a permanent magnet.

Figure 3:
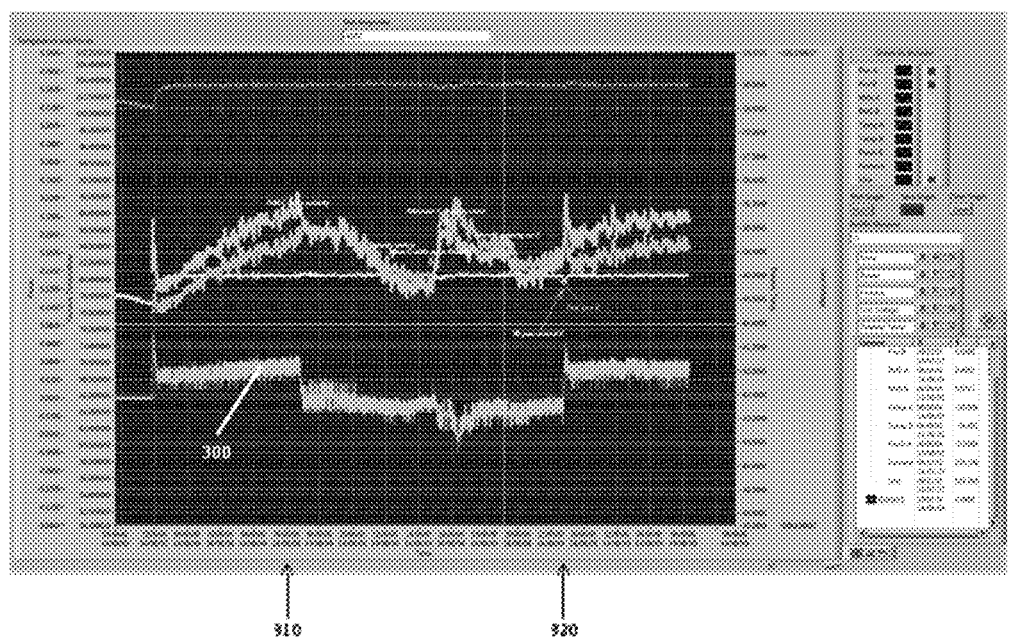
FIG. 3 shows results of the manipulation of a magnetic operating field on a heat-generating body of a heat engine of the inventive concept, demonstrating both initiation and termination of heat production.

FIG. 3 shows that modulation of the operating field can be used to modulate heat production in a fueled body. The difference in the power applied to a control body relative to a fueled body is shown in trace 300. A magnetic field originating from a permanent magnet and configured to initiate heat production as in the studies shown in FIG. 2 was applied as an operating field at the time point indicated as 310. The operating field was reconfigured (through rotation and vertical movement relative to the bodies) at the time point indicated as 320, resulting in a termination of heat production by the fueled body. Results from this experiment indicate power generation by the fueled body at 40 mW. Estimates based on the composition of the fueled bodies in the above studies indicate the power generation of a body containing 1 gram of palladium and fueled by deuterium approaching 1 kW or more when an appropriate operating field is applied.

Thus, specific compositions and methods of the inventive subject matter have been disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure all terms should be interpreted in the broadest possible manner consistent with the context. In particular the terms "comprises" and "comprising" should be interpreted as referring to the elements, components, or steps in a non-exclusive manner, indicating that the referenced elements, components, or steps can be present, or utilized, or combined with other elements, components, or steps that are not expressly referenced.

What is claimed is:

1. A heat engine comprising;
    a body that is permeable to a fuel species and comprising a dopant that has an affinity for the fuel species;
    a field source that provides an operating field, wherein at least a portion of the operating field intersects at least a portion of the body; and
    a field source controller that is operably connected to the field source and configured to modulate the operating field,
    wherein modulation of the operating field modulates heat generated within or on the body, and wherein the field source controller is configured to provide up to 1 kW per gram of dopant.

2. The heat engine of claim 1, wherein the modulation is selected from among the group consisting of intensity, polarity, duration, periodicity, and waveform.

3. The heat engine of claim 1, wherein the operating field is a magnetic field.

4. The heat engine of claim 1, wherein the body is in thermal communication with a working fluid.

5. The heat engine of claim 1, further comprising a thermoelectric device.

6. The heat engine of claim 1, wherein the dopant is selected from among the group consisting of nickel, platinum, and palladium.

7. The heat engine of claim 1, wherein the fuel species is a hydrogen isotope.

8. The heat engine of claim 3, wherein the magnetic field intensity ranges from the ambient intensity of the earth's magnetic field to 10,000 gauss.

9. The heat engine of claim 3, wherein the magnetic field is supplied by a field source that comprises a permanent magnet.

10. The heat engine of claim 1, wherein the heat engine does not generate heat when the temperature of the body falls below a first temperature.

11. The heat engine of claim 10, wherein the first temperature is at least 300° C.

12. The heat engine of claim 1, further comprising an activatable safety feature.

13. The heat engine of claim 12, wherein the activatable safety feature undergoes a change in a physical property above a second temperature, the physical property including at least one of the group consisting of phase, physical dimension, and conductivity, such that the change in the physical property renders the heat engine at least partially inoperable.

14. The heat engine of claim 12, wherein the activatable safety feature is detectable within the heat engine without the use of invasive or destructive techniques.

15. The heat engine of claim 12, wherein, when the temperature of the body exceeds a second temperature, the activatable safety feature releases a compound that combines with the fuel species to generate a non-fuel species that does not support the generation of heat.

16. The heat engine of claim 12, wherein, when the temperature of the body exceeds a second temperature, the activatable safety feature releases a compound that reduces the formation of complexes between the fuel species and the dopant.

17. The heat engine of claim 1, wherein body comprises a proton conductor configured to act as an activatable safety feature.

18. The heat engine of claim 3, wherein at least a portion of the magnetic field is supplied by a permanent magnet this is movable relative to the body.

* * * * *